US005532539A

United States Patent [19]

Hielscher

[11] Patent Number: 5,532,539
[45] Date of Patent: Jul. 2, 1996

[54] METHOD AND CIRCUITRY FOR THE SAFE OSCILLATION BUILD-UP OF ULTRASONIC DISINTEGRATORS

[75] Inventor: Harald Hielscher, Potsdam, Germany

[73] Assignee: Dr. Hielscher GmbH, Stahnsdorf, Germany

[21] Appl. No.: 267,414

[22] Filed: Jun. 28, 1994

[30] Foreign Application Priority Data

Jun. 30, 1993 [DE] Germany .......................... 43 22 388.5

[51] Int. Cl.$^6$ .......................... H01L 41/08

[52] U.S. Cl. .......................... 310/316

[58] Field of Search .......................... 310/316, 317; 318/116

[56] References Cited

U.S. PATENT DOCUMENTS

| | | | |
|---|---|---|---|
| 3,889,166 | 6/1975 | Scurlock | 318/116 |
| 4,277,710 | 7/1981 | Harwood et al. | 310/316 |
| 4,641,053 | 2/1987 | Takeda | 310/317 |
| 4,864,547 | 9/1989 | Krsna | 310/317 X |
| 4,879,528 | 11/1989 | Gotanda | 310/316 X |
| 4,965,532 | 10/1990 | Sakurai | 310/316 |
| 5,361,014 | 11/1994 | Antone et al. | 310/316 |
| 5,425,704 | 6/1995 | Sakurai et al. | 310/316 X |

FOREIGN PATENT DOCUMENTS

| | | |
|---|---|---|
| 0340470A1 | 11/1989 | European Pat. Off. . |
| 3222425A1 | 12/1983 | Germany . |

OTHER PUBLICATIONS

DE-Z "radio mentor", Apr. 1965, pp. 280–281.

*Primary Examiner*—Mark O. Budd
*Attorney, Agent, or Firm*—McGlew and Tuttle

[57] ABSTRACT

The present invention relates to a method for the safe oscillation build-up of ultrasonic disintegrators and to a circuitry for carrying-out the method. In particular the present invention is a method and a circuitry substantially irrespective of deviations of the mechanical resonance frequency, with a start/stop generator 8 that periodically blocks the output of the h.f. generator 1 and maintains the blocking for a fixed dead time and then periodically repeats this procedure if during the scanning of a wide frequency band of the h.f. generator 1 the feedback amplitude of the piezo-disc 4 disposed at the ultrasonic transducer 3 falls below the value required for a safe oscillation build-up.

1 Claim, 1 Drawing Sheet

METHOD AND CIRCUITRY FOR THE SAFE OSCILLATION BUILD-UP OF ULTRASONIC DISINTEGRATORS

FIELD OF THE INVENTION

The present invention relates to a method for the safe oscillation buildup of ultrasonic disintegrators and to a circuitry for carrying-out the method. In particular the present invention periodically interrupts the feeding of high frequency signals to an ultrasonic transducer when the ultrasonic transducer is operating below normal levels.

BACKGROUND OF THE INVENTION

Prior art control circuits of ultrasonic disintegrators operate at a constant operating frequency which is matched with the mechanical oscillating system of the ultrasonic transducer and which is operable only in a narrow frequency range. An ultrasonic disintegrator is composed of a h.f. generator converting the electrical mains power into h.f. power and of a sound transducer generating, in conjunction with an amplitude amplifier adapted as a $\lambda/2$ oscillator and a sonotrode, mechanical longitudinal oscillations of high power with large amplitudes.

In contrast to ultrasonic cleaning devices, ultrasonic disintegrators can be employed, in particular in the laboratory equipment technology, also for crushing or shattering smallest solid components in liquid substances, in order, e.g., to homogenize and create finest emulsions of difficult to mix substances.

In the German patent office publication DE 32 22 425 A1, a generator for driving a piezo-resonator is described. A safe oscillation build-up of the generator is to be secured even when the oscillation frequency of the resonator is reduced. For the purpose of a safe oscillation build-up, the frequency of the signals fed to the sound transducer is periodically modified about the resonance frequency of the transducer, until the feedback amplitude exceeds a certain limit. It is disadvantageous, among other reasons, that the circuit has to be matched to the resonance frequency of the ultrasonic oscillator, so that the operation of the ultrasonic oscillator cannot follow the modifications of the parameters of the ultrasonic oscillator.

In the EP 0 340 470 A1, a circuit for the excitation of an ultrasonic oscillator is described, which follows-up the excitation frequency according to the modifications of parameters of the ultrasonic oscillator. For this purpose, a measured quantity corresponding to tile attenuation of the ultrasonic oscillator is formed and compared to a predetermined maximum allowable attenuation. If the attenuation of the ultrasonic oscillator is smaller than the maximum allowable attenuation, the control voltage is also regulated, depending on the measured quantity.

Further, from DE-Z "radio mentor", 4/1965, p. 280–281, an ultrasonic welding device is known in tile art, including a generator provided with an automatic frequency control. For this purpose, a voltage is derived from the oscillator over a piezo-electrical trunk, the voltage being proportional to the oscillator amplitude. The power transmitted to tile material to be welded can thus be held constant during the welding time.

The narrow frequency range wherein ultrasonic transducers are operable, leads to different sonotrode types having substantial geometric differences which can only be difficultly operated with a single generator, that worn sonotrodes have to be replaced prematurely, and that a high production accuracy is required for the sonotrodes.

The disadvantages of the state of the art are also caused by large variations of the mechanical resonance frequency, as they can be caused by production tolerances, cavitation wear of the sonotrodes, thermal length variation of the sonotrodes or assembly mistakes. These variations in frequency may cause the transducers to not build-up oscillations and/or overload or destroy the power end stage of the control of the ultrasonic transducers.

SUMMARY AND OBJECTS OF THE INVENTION

It is therefore the object of the invention to eliminate such drawbacks and to develop a method and a circuits, by means of which a safe oscillation buildup of ultrasonic disintegrators is secured, that is substantially irrespective of deviation of the mechanical resonance frequency of the ultrasonic transducer from the desired frequency, e.g. by cavitation loss at the sonotrode or by thermal length extension or other parameters.

The solution of this object is achieved by periodically interrupting the feeding of high frequency signals to the ultrasonic transducer. When the feeding is continued, the high frequency signals start at an initial frequency spaced from an operating frequency of the ultrasonic transducer, either above or below the operating frequency, and then the frequency is varied, by either increasing or decreasing, until the operating frequency is reached. The present invention scans a wide frequency band of the h.f. generator, e.g. between 22 and 26 kHz, and simultaneously monitors the feedback amplitude and of the signals derived therefrom for the further operation of the h.f. generator in conjunction with a start/stop generator that periodically blocks the output of the h.f. generator. This allows safe build up of oscillations independent of mechanical system parameters and guarantees that different sonotrode types can be operated with a h.f. generator for longer periods of time than before, and that the requirements as to production tolerances for the sonotrodes are less stringent. Even for larger variations of the mechanical resonance frequency of the mechanical ultrasonic transducer caused by the various reasons, such as production tolerances, wear, thermally caused modifications, a safe oscillation build-up of the ultrasonic transducer is secured, and an overload or destruction of the ultrasonic transducer is safely prevented. Also the faulty coupling of a sonotrode or the complete absence of the sonotrode will not lead to a destruction or an overload of the employed electronic circuit.

The various features of novelty which characterize the invention are pointed out with particularity in the claims annexed to and forming a part of this disclosure. For a better understanding of the invention, its operating advantages and specific objects attained by its uses, reference is made to the accompanying drawings and descriptive matter in which preferred embodiments of the invention are illustrated.

BRIEF DESCRIPTION OF THE DRAWINGS

In the drawings.

The sole

DETAILED DESCRIPTION OF THE PREFERRED EMBODIMENT

Figure 1:
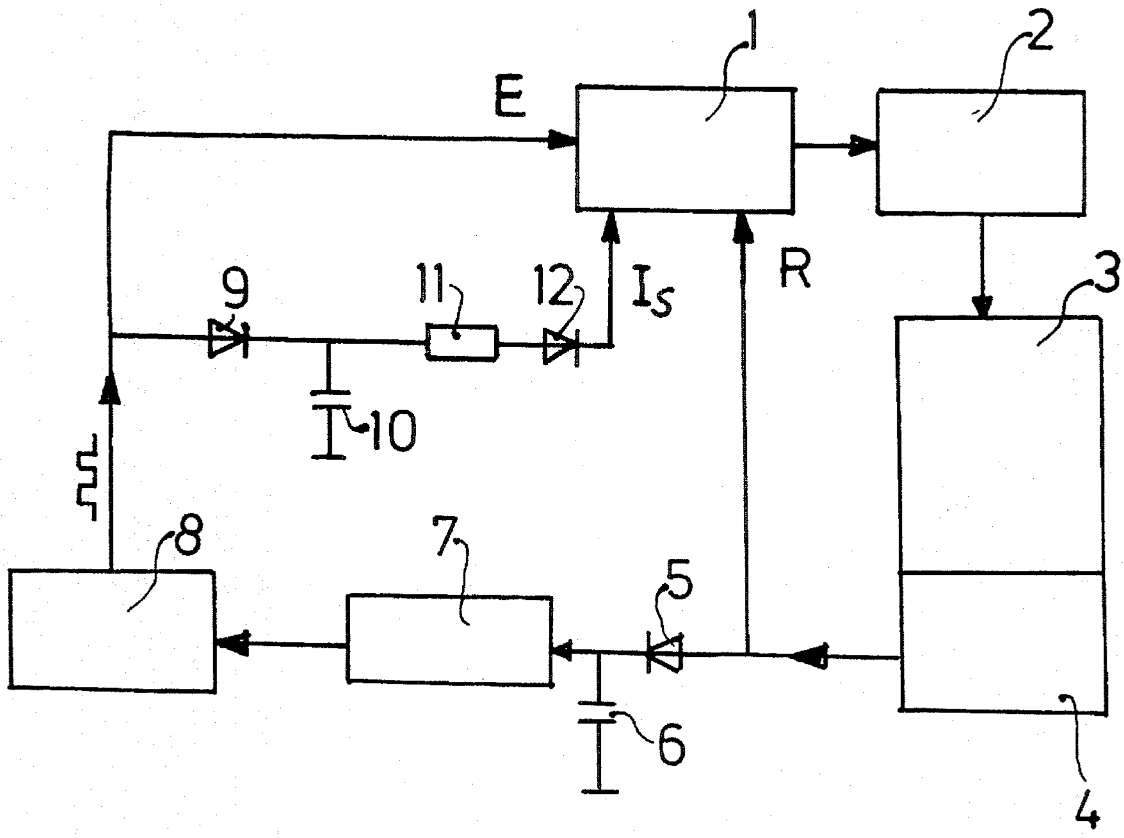
FIG. 1 shows the block diagram of the circuitry according to the invention.

The h.f. generator 1 shown in FIG. 1 produces electrical pulses amplified with a power switch 2, such as a driver stage or a switching transducer, and which excite an ultrasonic transducer 3 to mechanical oscillations. If the frequency of the h.f. generator 1 is identical to the mechanical oscillation frequency of the sonotrode of the ultrasonic transducer 3, resonance is present and the ultrasonic transducer 3 operates in its standard mode. A piezo-disc 4 is mechanically rigidly connected to the ultrasonic transducer 3 and converts the mechanical oscillations into a proportional electrical voltage. This voltage serves as a feedback signal and acts on the internal frequency control input R of the h.f. generator 1 and is further used for the evaluation of the oscillation build-up of the ultrasonic transducer 3.

The peak value of the feedback voltage delivered by the feedback element, known here as the piezo-disc 4, is rectified by means of a first diode 5 and a first capacitor 6, and is fed to the comparator 7 as all input signal. If the voltage at the first capacitor 6 is too small or below a predetermined value indicating that the ultrasonic transducer 3 is not operating in it's proper range, the comparator 7 activates a start/stop generator 8. The latter delivers pulses of a low frequency, approx. 1 s, to the h.f. generator 1 and switches it off and/or on again. A high signal at input E of the h.f. generator 1 causes no h.f. pulses to be fed to the power switch 2, and thus the ultrasonic transducer 3 is not excited.

The frequency of the h.f. generator 1 is influenced by a control current $I_s$. If the control current Is increases, the frequency of the h.f. generator 1 is reduced, and vice versa.

A high potential at the output of the start/stop generator 8 charges a second capacitor 10 over a second diode 9. The control current $I_s$ flows through a resistor 11 and a third diode 12, and the frequency of the h.f. generator 1 is lowered.

If the potential at the output of the start/stop generator changes to a lower potential, the h.f. pulses of the h.f. generator 1 are switched through to the power switch 2, and the ultrasonic transducer 3 is excited at a lower frequency. The second diode 9 is blocked and the second capacitor 10 discharges the control current $I_s$ over the resistor 11 and over the third diode 12 as an exponential function. The decreasing control current $I_s$ effects an increase of the frequency of the h.f. generator 1.

If the oscillation frequency of the h.f. generator 1 and the operating or resonance frequency of the ultrasonic transducer 3 are identical, the amplitude of the feedback voltage will sharply rise. The comparator 7 now switches the start/stop generator 8 off, and the h.f. generator 1 controls internally the frequency of the ultrasonic transducer 3.

What is claimed is:

1. A circuit for safely building up the frequency of ultrasonic disintegrator, the circuit comprising:

high frequency generator means for generating a range of high frequency signals;

ultrasonic transducer means connected to said high frequency generator means and for converting said high frequency signals into mechanical oscillations, said ultrasonic transducer means has an operating frequency;

measuring means for measuring and comparing an amplitude of said mechanical oscillations with a predetermined value, said measuring means includes a piezo-disc connected to said ultrasonic transducer means and also connected to a first side of a diode, a second side of said diode is connected to a side of a capacitor and connected to an input of a comparator;

start/stop means for cycling said high frequency generator on and off periodically when said amplitude of said mechanical oscillations is below said predetermined value, said start/stop means varies a frequency of said high frequency signals during said on cycles of said high frequency generator, said start/stop means starting said frequency of said high frequency signals at an initial frequency spaced from said operating frequency and then varying said frequency toward said operating frequency, said start/stop means includes means for generating and sending start/stop pulses to said high frequency generating means, said start/stop means also including a first diode having a first side receiving said start/stop pulses, a second side of said first diode being connected to a capacitor and a first side of a resistor, a second side of said resistor being connected to a first side of a second diode, and a second side of said first diode being connected to said high frequency generator means.

* * * * *